United States Patent [19]
Thwaites

[11] Patent Number: 5,631,050
[45] Date of Patent: May 20, 1997

[54] PROCESS OF DEPOSITING THIN FILM COATINGS

[75] Inventor: Michael Thwaites, Basingstoke, England

[73] Assignee: The BOC Group plc, Windlesham, England

[21] Appl. No.: 659,460

[22] Filed: Jun. 6, 1996

[30] Foreign Application Priority Data

Jun. 7, 1995 [GB] United Kingdom ............. 9511492

[51] Int. Cl.$^6$ ........................................... H05H 1/02
[52] U.S. Cl. ................. 427/571; 427/248.1; 427/294; 427/569; 427/585; 427/595
[58] Field of Search ........................ 427/571, 248.1, 427/294, 569, 585, 595, 598

Primary Examiner—Bernard Pianalto
Attorney, Agent, or Firm—David M. Rosenblum; Larry R. Cassett

[57] ABSTRACT

A process of depositing thin film coatings by evaporation in which a plasma is formed in an evacuated chamber and a source of material to be evaporated is provided which is evaporated to produce evaporated material. A substrate to be coated is located within the chamber and the evaporated material is caused to pass through the plasma and be to be deposited on the substrate. The plasma is generated by a helicon wave.

9 Claims, 1 Drawing Sheet

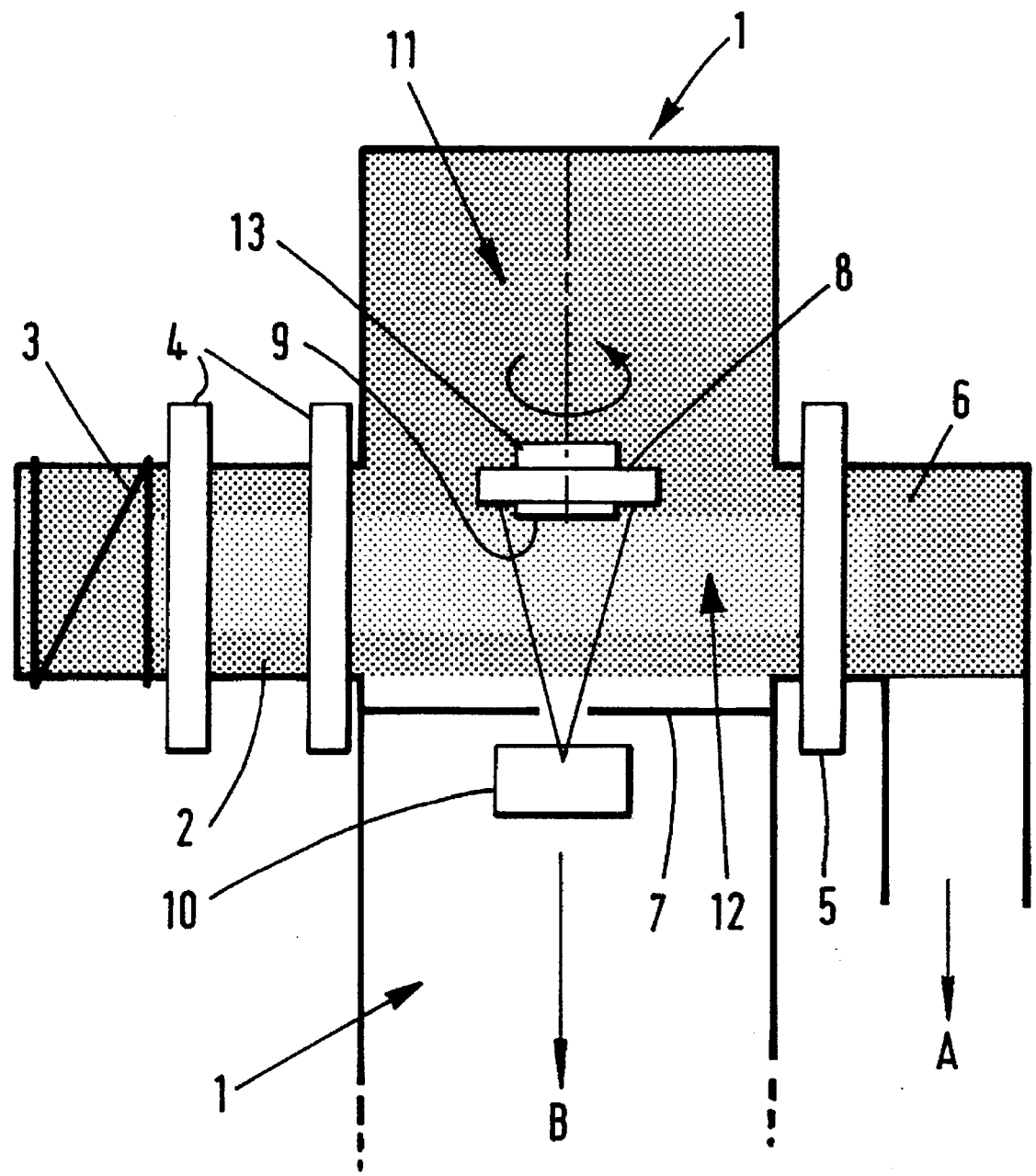

5,631,050

PROCESS OF DEPOSITING THIN FILM COATINGS

BACKGROUND OF THE INVENTION

This invention relates to methods and apparatus for the deposition of thin films and, more particularly, to the deposition of such films by means of plasma enhanced reactive deposition.

It has been known for many years that thin film deposition processes and the properties of the deposited films themselves can be improved by allowing energic ions to impinge on the growing surface of the film being deposited; this is due to an energy transfer between the energic ions and the so-called "adatoms" of the thin film being deposited. This increases the surface mobility of the adatoms and allows them to migrate more easily to the preferred lattice sites.

A convenient way of effecting energic ion impingement is to operate the deposition process in a plasma present in the process chamber, for example in sputtering, plasma enhanced chemical vapour deposition (PECVD) and ion assisted evaporation processes.

Critical to the success of such plasma deposition processes is the presence of a high ion density in the plasma, for example of the order of, or preferably in excess of $1 \times 10^{12}$ $cm^2$.

However presently available processes do suffer from certain disadvantages, in particular that they generally require to be operated at relatively high substrate temperatures, commonly of the order of 250° C. or above, to achieve the necessary film thicknesses and properties.

The present invention provides an improved plasma deposition process which generally allows for the deposition to be effected at reduced substrate temperatures whilst maintaining, and in many instances, improving the film characteristics.

SUMMARY OF THE INVENTION

In accordance with the invention, there is provided a process of depositing thin film coatings by evaporation which comprises forming a plasma in an evacuated chamber;

providing a source of material to be evaporated and evaporating material to produce evaporated material;

locating a substrate to be coated in the chamber;

causing the evaporated material to pass through the plasma and be deposited in the substrate;

wherein the plasma is generated by a helicon wave.

A helicon wave is known per se and can be produced in a chamber at high vacuum by interaction between a substantially uniform magnetic field and an electric field profile of an external antenna operating at a radio frequency (rf). Wave energy from the antenna emissions is transferred to the electrons produced in a plasma, for example argon, discharge present in the chamber by the well known mechanism known as Landau damping; in the case of helicon waves in particular, energy exchange is thought to occur in a much more efficient manner than with other types of discharge.

Radio frequency discharges of 13.56 MHz are preferred although related frequencies of 6.78 and 27.12 MHz could also usefully be employed.

The evaporation of the material to be deposited by the process of the invention may usefully be effected by:

i) electron beam ("e" beam) evaporation in which an electron beam gun emits electrons which are caused to impinge on the surface of a material to be evaporated in order to heat the material and therefore cause the evaporation, or ii) by thermal evaporation, for example by heating of the material to be evaporated.

both of which are well known per se.

The pressure in the deposition chamber should be from $10^{-2}$ to $10^{-3}$ mbar or lower to ensure the production of a plasma, for example an argon plasma. In the case of electron beam evaporation, the process chamber should preferably be of the order of $10^{-4}$ mbar or lower. Depending on the general process parameters, it may be necessary to introduce baffle plates in to the process chamber to vary the pressure in different parts of the chamber; in particular between that part in which the evaporation is occurring and that part in which the plasma is present.

The invention is especially useful in processes for the reactive evaporation of thin films in which a gaseous element or compound to be co-deposited with the evaporated material is present in the chamber.

The invention can usefully be performed in a chamber in which, or about which field coils are present to effect a substantially uniform magnetic field (commonly cylindrical) in a pre-determined area of the chamber. Such field coils can be conveniently spaced along the length of the relevant part of the chamber; preferably the coils are present in a linear array along the length of the chamber. Three field coils are normally sufficient but more may be employed if necessary.

At one end of the field coil array is positioned the rf antenna to cause, in use of the process of the invention, the intense helicon plasma wave, produced by interaction between the magnetic field and the rf power supply, which in turn accelerates plasma electrons by the mechanism of Landau damping.

In preferred embodiments of the invention, magnetic means are deployed in the vicinity of the substrate in order to attract and draw the plasma preferentially towards the substrate. It has been found that the presence of such magnetic means enhances the rate of deposition and also the quality and density of the thin film material.

Preferably the magnetic means is a single magnet, for example ring shaped, positioned behind the substrate (or substrate holder if present) relative to the plasma and with a polarity to ensure the ions of the plasma are attracted towards the substrate.

BRIEF DESCRIPTION OF THE DRAWINGS

For a better understanding of the invention, reference will now be made, by way of exemplification only, to the accompany drawing which shows a schematic cross sectional representation of a chamber in which the process of the invention can be performed.

DETAILED DESCRIPTION

The drawing shows a process chamber generally shown at 1 about an external surface of a generally cylindrical end 2 of which is positioned a radio frequency antenna 3 and two field coils 4.

A third field coil 5 is positioned about a generally cylindrical end 6 of the process chamber 1 such that the three field coils form a substantially linear array about a central part of the chamber 1.

A baffle plate 7 of circular cross section and of a diameter conforming to the size/shape of a lower part of the chamber 1 is present to divide the central part of the chamber and the lower part; the plate 7 has a central aperture as shown in the drawing.

At the top of the central part of the chamber 1 is positioned a substrate holder 8 to which can be attended by means not shown a substrate 9 on whose surface the main thin film is to be deposited.

In the lower part of the chamber, beneath the baffle plate 7 is positioned a source 10 of material to be evaporated by, for example "e" beam means or by thermal means. The source 10 can be placed in any useful container, for example a metal "boat" of tungsten or other substrate material.

Vacuum pumps (not shown) are provided to evacuate (primarily) the upper and central parts of the chamber 1 in the direction shown by the arrow A and to evacuate (primarily) the lower part of the chamber 1 beneath the baffle plate 7 in the direction shown by the arrow B. Arrow A evacuation is by means of the turbo-molecular plus backing (rotary) pump system whereas arrow B evacuation is by means of a diffusion pump plus rotary pump system or an additional turbo-molecular pump plus backing (rotary) pump.

The vacuum pump systems operator to allow, in use, the pressure in the upper and central parts of the chamber 1 to be operated at a different pressure to that in the lower part of the chamber although the central aperture in the baffle plate 7 will allow for a certain equalisation of pressure over time. This is appropriate when using "e" beam evaporation techniques in particular when the lower part of the chamber which the evaporation is occurring will generally need to be at a higher vacuum than that in the central and upper parts of the chamber containing the plasma.

In use of the apparatus shown in the drawing, the vacuum pump systems are operated to produce a vacuum in the upper and central parts of the chamber 1 of above about $1\times10^{-3}$ mbar and a vacuum in the lower part of the chamber (beneath the baffle plate 7) of below about $1\times10^{-4}$ mbar.

The upper and central parts of the chamber itself were initially pumped down to $1\times10^{-5}$ mbar. Pure oxygen (as the reactive gas) and pure argon (as the plasma gas) were injected into the chamber 1 such that their partial pressures were about $3\times10^{-4}$ mbar and $1\times10^{-3}$ mbar respectively.

The three field coils 4, 4, 5 were set to produce a uniform magnetic field of about 200 Gauss and the antenna set at an rf power of about 2 KW and a frequency of 13.56 MHz. This produced a plasma throughout the chamber 1 (at least in the upper and central parts thereof) as shown by reference arrow 11 of a fairly uniform (blue/pink) colour characteristic of predominantly excited argon, with a central predetermined region within the field coil array of a cylindrical central plasma shown by the reference arrow 12 characteristic of a mainly ionised argon plasma. The latter was the helicon plasma wave.

A cleaned target comprising a glass slide substrate 9 positioned beneath (as shown) the substrate holder 8 had been inserted into the chamber 1. Also, indium was placed in a tungsten boat as the evaporation source 10 and thermally evaporated therefrom.

By virtue of negative biassing of the substrate relative to the positive argon ions of the plasma, evaporated ionised indium is drawn through the circular aperture of the baffle plate 7 to interact with the argon plasma such that both indium and oxygen are co-deposited as $In_xO_y$ on the substrate. A deposition rate of the order of 3 mm/sec to 4 mm/sec was achieved without heating the substrate.

At the end of the deposition process "runs" in each of a number of the substrate was removed from the chamber and its surface temperature measured with a thermocouple probe. Typically after each one minute deposition run, the temperature was about 50° to 60° C. caused by heating from the plasma and not by direct heating of the substrate, using heated wire or other thermal sources.

In addition, the coatings on the substrates were found to be hard to scratch and visually transparent with a thickness, as measured by a step profiler (a Talystep profiler) of between 180 and 240 nm and sheet resistance (as measured on a four point probe) of from 20Ω/square to 30Ω/square depending on coating thickness.

Some typical growth conditions and film characteristics of deposited $In_xO_y$ films are shown in the Table below:

| Substrate temperature | RF power | Specific resistivity | Growth rate | Thickness |
| --- | --- | --- | --- | --- |
| 50° C. | 2 K watt | $5 \times 10^{-4}$ Ωcm | 3 nm/sec | 180 nm |

The process of the invention has been found to be useful in general for different types of coating on different substrates.

In addition to indium oxide coatings, good results have been shown with aluminium oxide coatings. In both cases, both glass and metal substrate have been used, the latter including mild steel, copper and brass.

Further tests were conducted using the apparatus shown in the drawing as described above but also utilising a magnetic means in the form of a ring shaped iron magnet 13 positioned immediately behind the substrate holder 8 relative to the plasma 12.

This magnet had the function of drawing the plasma 12 preferentially in the direction of the substrate 9 and was found to increase the rate of deposition of deposited $In_xO_y$ films and to improve film quality. The tests were conducted in exactly the same manner as those described above, the only difference being the use of the magnet 13.

I claim:

1. A process of depositing thin film coatings by evaporation comprising:

forming a plasma in an evacuated chamber;

providing a source of material to be evaporated and evaporating material to produce evaporated material;

locating a substrate to be coated in the chamber; and causing the evaporated material to pass through the plasma and be to be deposited on the substrate;

the plasma being generated by a helicon wave.

2. The process according to claim 1 in which the evaporation is effected by electron beam evaporation in which an electron beam gun emits electrons which are caused to impinge on the surface of the material to be evaporated.

3. The process according to claim 1 in which the evaporation is effected by thermal evaporation.

4. The process according to claim 1 in which field coils are present to effect a substantially uniform magnetic field in an area of the chamber.

5. The process according to claim 4 in which the field coils are spaced along the length of the relevant part of the chamber.

6. The process according to claim 4 in which the coils are present in a linear array along the length of the chamber.

7. The process according to claim 4 in which three field coils are employed.

8. The process according to claim 1 in which magnetic means are deployed in the vicinity of the substrate in order to attract and draw the plasma preferentially towards the substrate.

9. The process according to claim 8 in which the magnetic means is a single magnet positioned behind the substrate relative to the plasma and with a polarity to ensure the ions of the plasma are attracted towards the substrate.

* * * * *